United States Patent
Wada et al.

(10) Patent No.: US 10,132,918 B2
(45) Date of Patent: Nov. 20, 2018

(54) ANTENNA APPARATUS AND ARRAY ANTENNA APPARATUS FOR RADAR

(71) Applicant: Kabushiki Kaisha Toshiba, Minato-ku (JP)

(72) Inventors: Yasuaki Wada, Yokohama (JP); Shinji Tamai, Yokohama (JP); Taihei Nakada, Yokosuka (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 343 days.

(21) Appl. No.: 15/188,354

(22) Filed: Jun. 21, 2016

(65) Prior Publication Data
US 2017/0261597 A1 Sep. 14, 2017

(30) Foreign Application Priority Data
Mar. 9, 2016 (JP) ................. 2016-046086

(51) Int. Cl.
*G01S 7/282* (2006.01)
*G01S 7/03* (2006.01)
(Continued)

(52) U.S. Cl.
CPC .............. *G01S 7/282* (2013.01); *G01S 7/032* (2013.01); *H01Q 21/0006* (2013.01);
(Continued)

(58) Field of Classification Search
CPC ........ G01S 7/032; G01S 7/282; G01S 7/4008; G01S 7/4017; G01S 7/4021; G01S 7/352;
(Continued)

(56) References Cited

U.S. PATENT DOCUMENTS 4,870,421 A 9/1989 Peil et al.
5,136,300 A 8/1992 Clarke et al.
(Continued)

FOREIGN PATENT DOCUMENTS

EP 0 539 353 A2 4/1993
JP 2000-196334 A 7/2000
(Continued)

OTHER PUBLICATIONS

Extended European Search Report dated Jul. 12, 2017 in Patent Application No. 16175680.4.

*Primary Examiner* — Olumide Ajibade Akonai
(74) *Attorney, Agent, or Firm* — Oblon, McClelland, Maier & Neustadt, L.L.P.

(57) ABSTRACT

According to one embodiment, an antenna apparatus includes a plurality of amplifier circuits, a common drain control circuit, a gate control circuits, and an antenna controller. The common drain control circuit constitutes a control circuit common to the plurality of amplifier circuits, and controls a drain voltage of a field-effect transistor included in each of the amplifier circuits. The gate control circuits are provided for each amplifier circuit, and controls a gate voltage of the field-effect transistor. The antenna controller controls the common drain control circuit and the gate control circuits, and selectively operates the plurality of amplifier circuits by controlling an output of the gate voltage prior to the drain voltage.

13 Claims, 5 Drawing Sheets

(51) Int. Cl.
*H01Q 21/00* (2006.01)
*H03K 19/00* (2006.01)
*H03K 19/017* (2006.01)

(52) U.S. Cl.
CPC ..... *H01Q 21/0025* (2013.01); *H03K 19/0013* (2013.01); *H03K 19/01721* (2013.01)

(58) Field of Classification Search
CPC ......... H03K 19/0013; H03K 19/01721; H03K 17/04163; H03F 2200/102; H03F 1/0277; H03F 2200/18; H03F 2200/156; H03F 3/193; H03F 3/195; H01Q 21/0006; H01Q 21/06; H01Q 21/0025
See application file for complete search history.

(56) References Cited

U.S. PATENT DOCUMENTS

| | | | |
|---|---|---|---|
| 5,412,414 A | 5/1995 | Ast et al. | |
| 5,945,941 A | 8/1999 | Rich, III et al. | |
| 6,559,798 B1 | 5/2003 | Marumoto et al. | |
| 7,468,690 B2* | 12/2008 | Green | G01S 7/4017 342/174 |
| 9,287,870 B2* | 3/2016 | Richardson | G01S 7/02 |
| 2004/0061380 A1 | 4/2004 | Hann et al. | |
| 2013/0088378 A1* | 4/2013 | Kobayashi | G01S 7/282 342/27 |
| 2014/0043083 A1* | 2/2014 | Hirayama | G01S 7/282 327/299 |
| 2015/0130657 A1 | 5/2015 | Richardson et al. | |
| 2015/0236691 A1* | 8/2015 | Cam | H03K 17/687 343/876 |

FOREIGN PATENT DOCUMENTS

| | | |
|---|---|---|
| JP | 2015-197404 A | 11/2015 |
| JP | 5806076 | 11/2015 |
| WO | WO 01/69725 A1 | 9/2001 |
| WO | WO 2015/069375 A1 | 5/2015 |

* cited by examiner

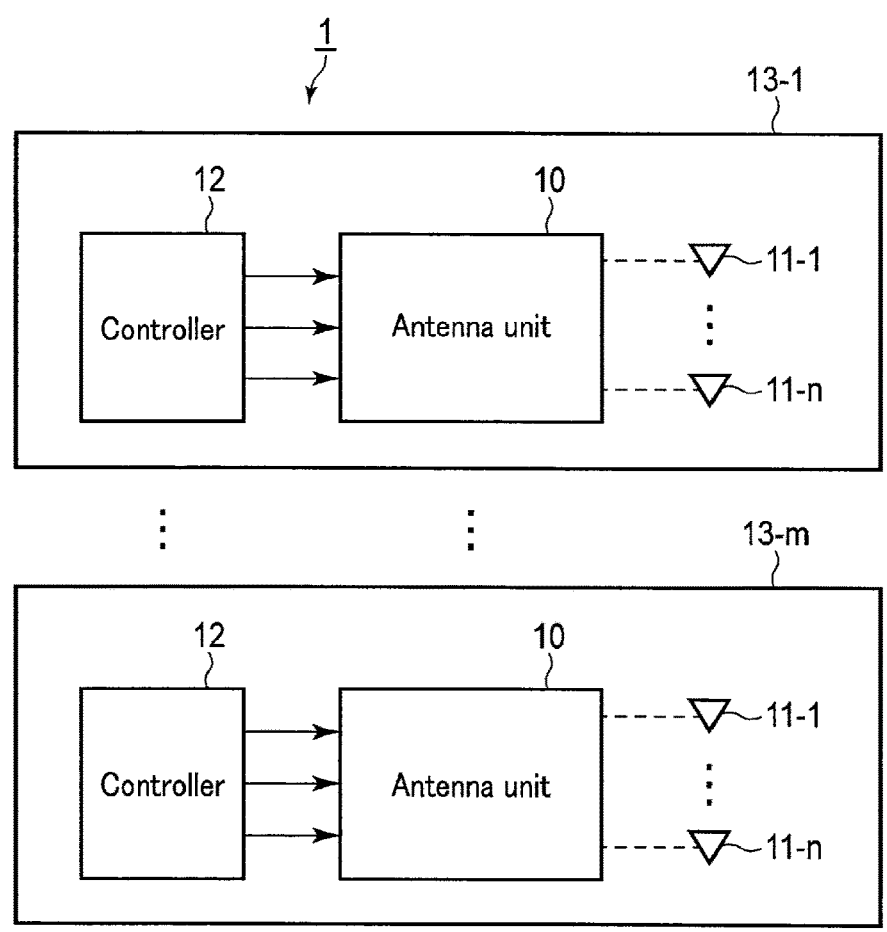
F I G. 1

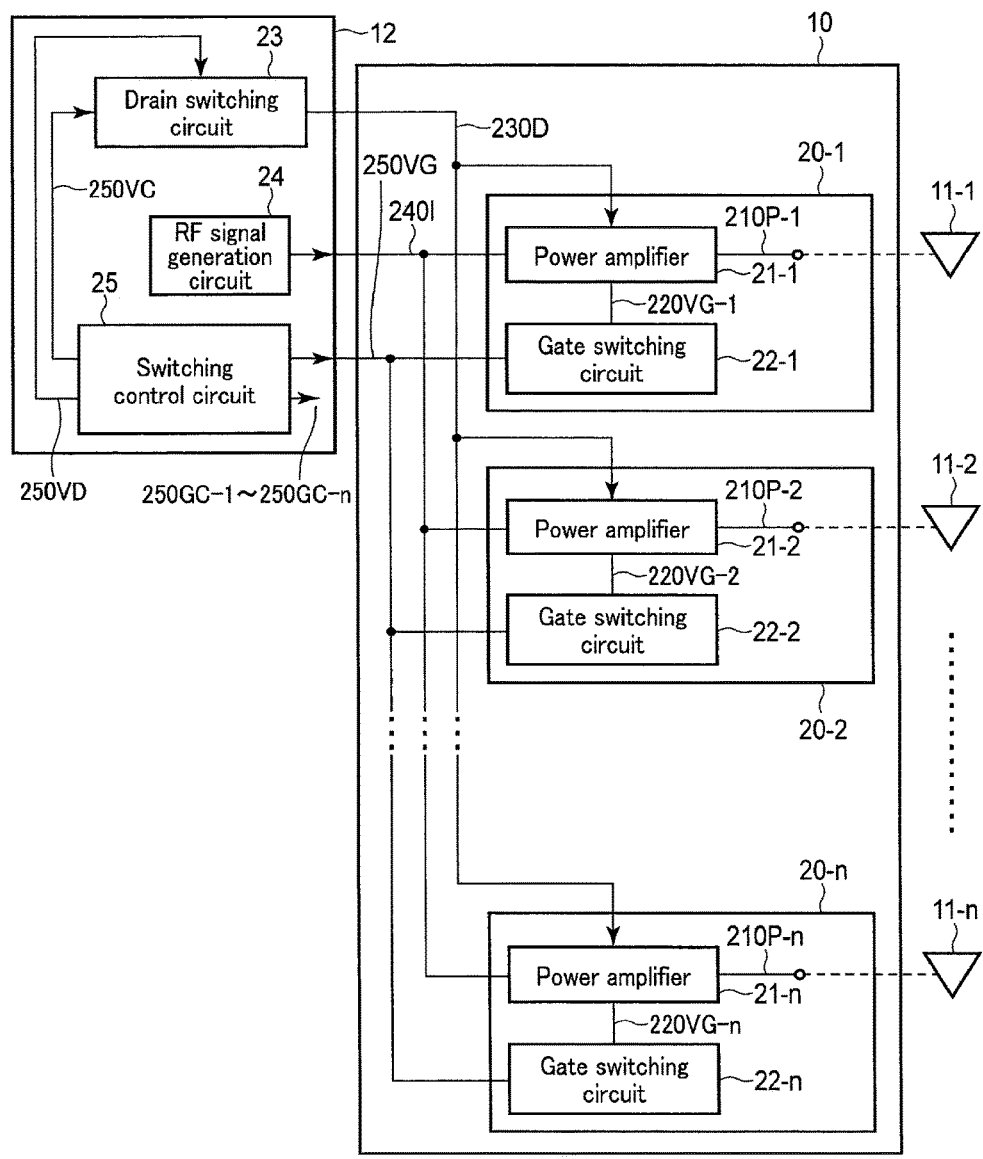
F I G. 2

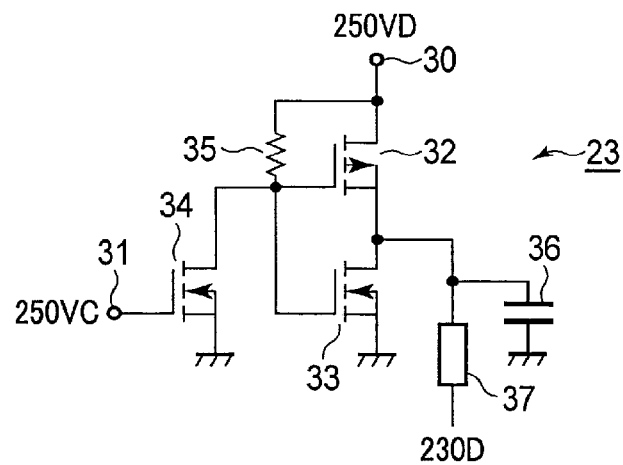
F I G. 3
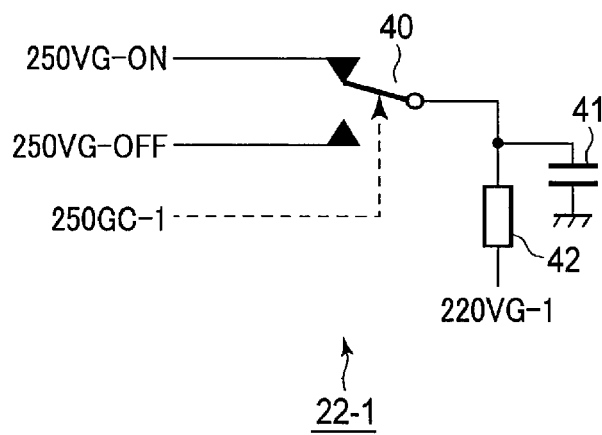
F I G. 4

ANTENNA APPARATUS AND ARRAY ANTENNA APPARATUS FOR RADAR

CROSS-REFERENCE TO RELATED APPLICATIONS

This application is based upon and claims the benefit of priority from the Japanese Patent Application No. 2016-046086, filed Mar. 9, 2016, the entire contents of which are incorporated herein by reference.

FIELD

Embodiments described herein relate generally to an antenna apparatus and an array antenna apparatus for use in a radar.

BACKGROUND

Conventionally, for example, in a radar mounted on an aircraft, in many cases, an array antenna apparatus is used which transmits radio-frequency pulse signals (hereinafter referred to as "RF pulse signals" in some cases) from a plurality of antenna elements. The RF pulse signals are reflected by an object, and the radar receives the reflection signals by the antenna elements of the array antenna apparatus, thereby detecting the object.

In general, an array antenna apparatus includes a plurality of antenna units, and is configured to execute transmission/reception via a plurality of antenna elements on an antenna unit by antenna unit basis. Each antenna unit supplies RF pulse signals, which are generated by RF pulse signal generation circuits, to the respective antenna elements. The RF pulse signal generation circuit is provided for each antenna element, and includes an amplifier circuit (power amplifier circuit) which is composed of an FET (field-effect transistor).

Conventionally, the RF pulse signal generation circuit includes a switching circuit which controls the drain voltage of the FET. By this switching circuit, the rise and fall of the RF pulse signal are controlled, and the response speed characteristics, which are necessary for high-speed transmission/reception of the radar, are realized. Here, since the high-speed switching circuit employs a plurality of FETs, the circuit configuration is complex. In addition, since a large high-voltage current flows in the drain of the FET, which constitutes the power amplifier circuit, a capacitor with a large capacitance is used as a peripheral circuit.

The RF pulse signal generation circuit is provided for each antenna element. Thus, as a result, the circuit scale of each individual antenna unit becomes relatively large. Hence, for example, in the antenna apparatus for use in a radar mounted on an aircraft, since the mounting space and weight are limited, a challenge lies in how to realize reduction in circuit scale of each individual antenna unit. In addition, there is a case in which the radar changes, based on an operation mode, the number of antenna elements which are control objects. In the conventional RF pulse signal generation circuit, since the drain voltage of the FET is constant, there is a case in which the output of the RF pulse signal becomes unstable when the number of antenna elements was changed. Thus, there is also a challenge in how to realize stabilization of output characteristics of the RF pulse signal in accordance with the number of antenna elements.

BRIEF DESCRIPTION OF THE DRAWINGS

FIG. 1 is a block diagram for describing the configuration of an array antenna apparatus of embodiments;

FIG. 2 is a block diagram for describing the configuration of an antenna apparatus of a first embodiment;

FIG. 3 is a circuit diagram illustrating an example of a drain switching circuit of the first embodiment;

FIG. 4 is a circuit diagram illustrating an example of a gate switching circuit of the first embodiment;

DETAILED DESCRIPTION

Figure 5A:
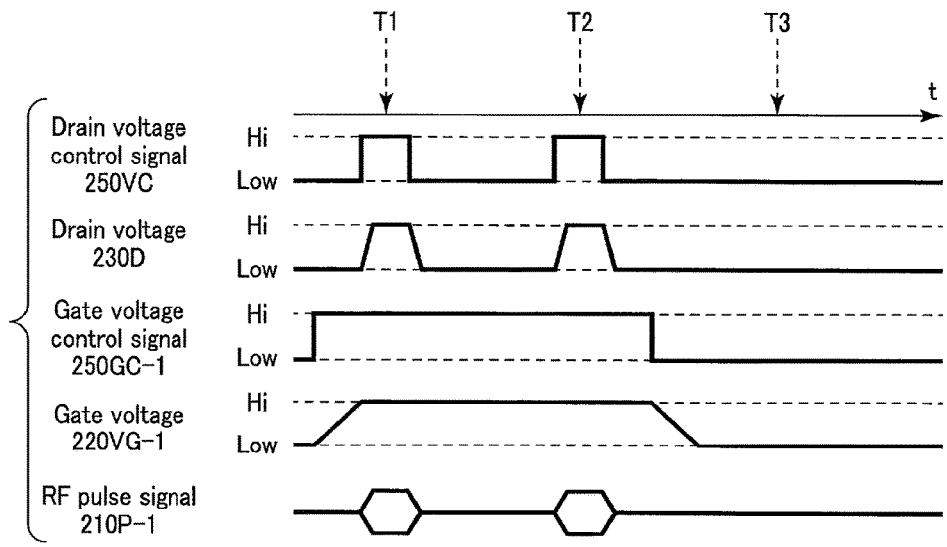
FIG. 5A is a timing chart for describing the operation of the antenna apparatus of the first embodiment.

In general, according to one embodiment, an antenna apparatus includes a plurality of amplifier circuits, a common drain control circuit, a gate control circuits, and an antenna controller. The amplifier circuits output transmission pulse signals to a plurality of antenna elements, respectively. The common drain control circuit constitutes a control circuit common to the plurality of amplifier circuits, and controls a drain voltage of a field-effect transistor included in each of the amplifier circuits. The gate control circuits are provided for each amplifier circuit, and controls a gate voltage of the field-effect transistor. The antenna controller controls the common drain control circuit and the gate control circuits, and selectively operates the plurality of amplifier circuits by controlling an output of the gate voltage prior to the drain voltage.

Various embodiments will be described hereinafter with reference to the accompanying drawings.

[Configuration of Array Antenna Apparatus]

FIG. 1 is a block diagram illustrating the configuration of an array antenna apparatus relating to embodiments. As illustrated in FIG. 1, an array apparatus 1 is used, for example, for a radar which is mounted on an aircraft, and is configured such that a plurality of antenna apparatuses 13-1 to 13-$m$ are arrayed. In addition, each of the antenna apparatuses 13-1 to 13-$m$ is configured such that a plurality of antenna elements 11-1 to 11-$n$ are arrayed. Each of the antenna apparatuses 13-1 to 13-$m$ includes an antenna unit 10 and a controller 12.

FIG. 2 is a block diagram for describing the configuration of one antenna apparatus 13-1 as an example of a first embodiment. Incidentally, the other antenna apparatuses 13-2 to 13-$m$ have similar configurations.

As illustrated in FIG. 2, the antenna unit 10 includes RF pulse signal generation circuits 20-1 to 20-$n$ corresponding to the antenna elements 11-1 to 11-$n$, respectively. The RF pulse signal generation circuits 20-1 to 20-$n$ include power amplifier circuits 21-1 to 21-$n$, and gate switching circuits 22-1 to 22-$n$, respectively. The power amplifier circuits 21-1 to 21-$n$ include power FETs (field-effect transistors (not shown)), respectively, for outputting RF pulse signals 210P-1 to 210P-$n$ to the antenna elements 11-1 to 11-$n$.

Here, the embodiment relates to a transmission system which transmits RF pulse signals of a radar. In the embodiment, a reception system which receives refection signals is omitted. In addition, since the RF pulse signal generation circuits 20-1 to 20-$n$ have the same configuration, there is a case in which the configuration of the RF pulse signal generation circuit 20-1 corresponding to the first antenna element 11-1 is representatively described for the purpose of convenience.

As illustrated in FIG. 2, the RF pulse signal generation circuit 20-1 includes the power amplifier circuit 21-1 and gate switching circuit 22-1, and outputs the RF pulse signal 210P-1 to the antenna element 11-1 from the power amplifier 21-1. As will be described later, the gate switching circuit 22-1 outputs a gate voltage 220VG-1 of the power FET which is included in the power amplifier circuit 21-1. Incidentally, the other RF pulse signal generation circuits 20-2 to 20-n have similar configurations.

As illustrated in FIG. 2, the controller 12 is an antenna controller which includes a drain switching circuit 23, an RF signal generation circuit 24 and a switching control circuit 25, and is provided in association with each individual antenna unit 10. The drain switching circuit 23 of the embodiment is a switching circuit which is common to the RF pulse signal generation circuits 20-1 to 20-n included in the antenna unit 10. The drain switching circuit 23 outputs a drain voltage 230D of each of the power FETs included in the power amplifier circuits 21-1 to 21-n.

The RF signal generation circuit 24 generates and outputs an RF signal 2401 of the transmission system of the radar to each of the power amplifier circuits 21-1 to 21-n. Specifically, the power amplifier circuits 21-1 to 21-n output RF pulse signals 210P-1 to 210P-n, respectively, to the antenna elements 11-1 to 11-n in accordance with the input of the RF signal 2401.

The switching control circuit 25 outputs to each of the gate switching circuits 22-1 to 22-n a driving voltage 250VG of the switching circuit and a gate voltage control signal, 250GC-1 to 250GC-n. The switching control circuit 25 outputs to the common drain switching circuit 23 a drain voltage control signal 250VC and a driving voltage 250VD for driving each FET (field-effect transistor) of the drain switching circuit 23.

FIG. 3 is a schematic view illustrating a concrete example of the drain switching circuit 23. As illustrated in FIG. 3, the drain switching circuit 23 includes an input terminal 30 for receiving the driving voltage 250VD, an input terminal 31 for receiving the drain voltage control signal 250VC, a plurality of FETs 32 to 34, a resistor 35, a capacitor 36, and an inductor 37. The drain switching circuit 23 outputs the drain voltage 230D, which corresponds to the drain voltage control signal (control pulse) 250VC that is input from the switching control circuit 25 to the input terminal 31, to the drain of each power FET included in each power amplifier circuit, 21-1 to 21-n, via the inductor 37.

FIG. 4 is a schematic view which representatively illustrates a concrete example of the gate switching circuit 22-1. As illustrated in FIG. 4, the gate switching circuit 22-1 includes a switch circuit 40, which is composed of, for example, an operational amplifier, a capacitor 41, and an inductor 42. The gate switching circuit 22-1 controls the switch circuit 40 in accordance with the gate voltage control signal 250GC-1, and outputs the gate voltage 220VG-1 to the gate of the power FET included in the power amplifier 21-1 via the inductor 42.

Hereinafter, referring to timing charts of FIG. 5A and FIG. 5B, the operation of the antenna apparatus 13 relating to the first embodiment is described. For the purpose of convenience, FIG. 5A is a timing chart relating to the RF pulse signal generation circuit 20-1 corresponding to the first antenna element 11-1. In addition, FIG. 5B is a timing chart relating to the RF pulse signal generation circuit 20-2 corresponding to the second antenna element 11-2.

Figure 5B:
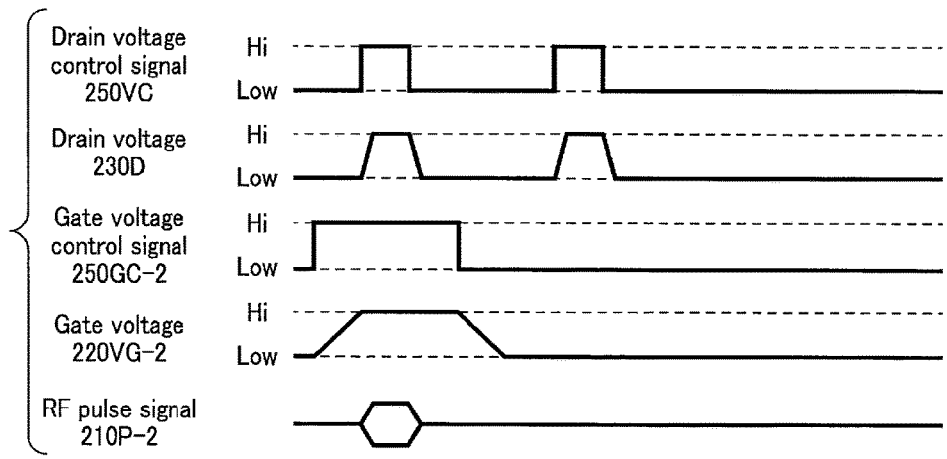
FIG. 5B is a timing chart for describing the operation of the antenna apparatus of the first embodiment.

In the timing charts of FIG. 5A and FIG. 5B, a timing T1 on a time axis t indicates a case in which the RF pulse signal, 210P-1 to 210P-n, is output to any of the antenna elements 11-1 to 11-n in the antenna unit 10. Similarly, a timing T2 on the time axis t indicates a case in which the RF pulse signal 210P-1 is output to only the antenna element 11-1 in the antenna unit 10. Further, a timing T3 on the time axis t indicates a case in which the RF pulse signal, 210P-1 to 210P-n, is output to none of the antenna elements 11-1 to 11-n in the antenna unit 10.

In the antenna apparatus 13-1 of the present embodiment, the controller 12 controls the output of the drain voltage 230D from the drain switching circuit 23, when the RF pulse signal is output and transmitted from one or more antenna elements 11-1 to 11-n in units of the antenna unit 10. Specifically, as illustrated in FIG. 5A and FIG. 5B, except for the case (T3) of turning off the output of each of the antenna elements 11-1 to 11-n, the drain switching circuit 23 outputs the drain voltage 230D to each FET of the power amplifiers 21-1 to 21-n in accordance with the drain voltage control signal 250VC from the switching control circuit 25.

On the other hand, the controller 12 outputs the gate voltages 220VG-1 and 220VG-2 to the power FETs of the power amplifier circuits 21-1 and 21-2 corresponding to the antenna elements (11-1 and 11-2 in this case) that are caused to output the RF pulse signals. Specifically, as illustrated in FIG. 5A and FIG. 5B, the gate switching circuits 22-1 and 22-2 output the gate voltages 220VG-1 and 220VG-2 to the power FETs of the power amplifier circuits 21-1 and 21-2 in accordance with the gate voltage control signals 250GC-1 and 250GC-2 from the switching control circuit 25.

The switching control circuit 25 outputs the gate voltage control signals 250GC-1 and 250GC-2 to the gate switching circuits 22-1 and 22-2, such that the gate voltages 220VG-1 and 220VG-2 are output to the power FETs of the power amplifier circuits 21-1 and 21-2 prior to the output of the drain voltage 230D. In addition, the switching control circuit 25 outputs the drain voltage control signal 250VC to the drain switching circuit 23, such that the drain voltage 230D is output to each power FET. Thereby, the RF pulse signal 210P-1, 210P-2 can be output to the antenna element 11-1, 11-2 selected from the antenna unit 10, and the RF pulse signal corresponding to the RF pulse signal 210P-1, 210P-2 can be transmitted from the antenna element 11-1, 11-2.

Accordingly, as indicated by the timing T1 in FIG. 5A and FIG. 5B, the power amplifier circuits 21-1 and 21-2 output the RF pulse signals 210P-1 and 210P-2 to the antenna elements 11-1 and 11-2 in accordance with the input of the RF signal 2401.

Here, as indicated by the timing T1 of FIG. 5B, the switching control circuit 25 outputs the gate voltage control signal 250GC-2 to the gate switching circuit 22-2, such that the gate voltage 220VG-2 is output to the power FET of the power amplifier circuit 21-2 prior to the output of the drain voltage 230D. Thereby, the RF pulse signal 210P-2 can be output to the antenna element 11-2 selected from the antenna unit 10, and the RF pulse signal corresponding to the RF pulse signal 210P-2 can be transmitted from the antenna element 11-2.

According to the above-described first embodiment, the following advantageous effects can be obtained. First, the drain voltage 230D and gate voltage, 220VG-1 to 220VG-n, of each power FET of the power amplifier circuits 21-1 to 21-n can be individually controlled. Thereby, the RF pulse signal, 210P-1 to 210P-n, can selectively be output to any of the antenna elements 11-1 to 11-n in the antenna unit 10. In this case, the reduction in circuit scale of each individual antenna unit can be realized by making the drain switching circuit 23, which outputs the drain voltage 230D, common to the individual antenna units. In particular, the embodiment is effectively adaptive to the antenna apparatus 13 which is used for the radar mounted on, for example, an aircraft.

Secondly, since the gate voltage, 220VG-1 to 220VG-n, can be output to each FET of the power amplifier circuits 21-1 to 21-n at a timing prior to the output of the drain voltage 230D, each power FET can be made to operate in a good condition of transient characteristics of the power FET. In addition, by controlling the switching of the drain voltage on an antenna unit by antenna unit basis, a high response speed of the rise and fall of the RF pulse signal can be realized. Specifically, the waveform and transmission/reception switching speed of the RF pulse signal depend on the switching control of the drain voltage.

Furthermore, in the present embodiment, the above-described high response speed for the RF pulse signal can be realized, and each antenna element can selectively be made to function, by controlling the switching of the gate voltage on an antenna element by antenna element basis. Specifically, by controlling the switching of the gate voltage on an antenna element by antenna element basis, it is easily realizable to change the number of antenna elements that are made to effectively function, so that the RF pulse signal can be transmitted in accordance with each of operation modes of the antenna apparatus 13. The operation mode of the antenna apparatus 13 is set by the interval of RF pulse signals to be transmitted, and the number of antenna elements which are made to function.

Specifically, the interval of RF pulse signals is determined by the switching cycle of transmission/reception of the radar in one operation mode. In order to secure long reception periods, it is necessary to shorten the switching time of transmission/reception. Thus, in one operation mode, it is required to control at high speed the rise and fall of the RF pulse signals, which are transmitted, by the drain switching. The number of antenna elements determines the effective distance and effective range of the radar. As the number of antenna elements increases, the effective distance becomes longer, and the effective range becomes narrower. Here, since the timing of switching the number of antenna elements (the timing of switching the operation mode) has no relation to the timing at which the radar executes transmission/reception, the high-speed property for the response speed (rise and fall) of pulses is not always necessary (see waveforms of gate voltages 220VG-1 and 220VG-2 shown in FIG. 5A and FIG. 5B).

Figure 6:
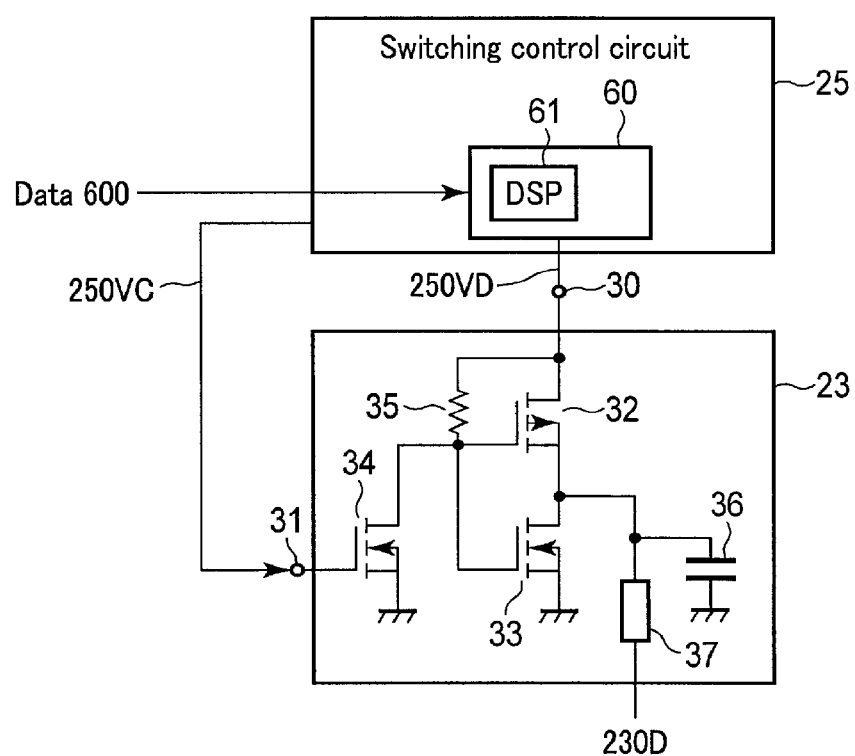
FIG. 6 is a block diagram for describing the configuration of a switching control circuit of a second embodiment.

FIG. 6 is a view illustrating the configuration of a switching control circuit 25 relating to a second embodiment. As illustrated in FIG. 6, the switching control circuit 25 is configured to include a digital control power supply circuit 60 for controlling the drain voltage 230D which is output from the drain switching circuit 23. Here, since the other configurations, including the drain switching circuit 23, are the same as in the case of the above-described first embodiment (see FIG. 1 to FIG. 4), a description thereof is omitted.

The digital control power supply circuit 60 includes a DSP (digital signal processor) 61. The DSP 61 includes a function of switching the setting of the voltage value and driving current value of the driving voltage 250VD for driving each FET of the drain switching circuit 23, in accordance with data 600 indicative of information of the number of antenna elements which are caused to function. Here, the data 600 indicative of information of the number of antenna elements is output from a controller of the radar which switches the operation mode of the antenna apparatus 13. Specifically, the controller of the radar, as described above, changes the number of antenna elements which are made to function, in association with each of the operation modes of the antenna apparatus 13-1.

According to the second embodiment, the driving voltage 250VD of the drain switching circuit 23 can be controlled in accordance with the number of antenna elements which are caused to function. Thus, the drain voltage 230D, which is supplied to each power FET of the power amplifier circuits 21-1 to 21-n, can be adjusted. Accordingly, the output characteristics of the RF pulse signals, which are output from the power amplifier circuits 21-1 to 21-n, can be stabilized. Specifically, it is possible to realize stabilization of the response speed of the rise and fall of the RF pulse signal, and stabilization of the output level.

In general, when the driving voltage 250VD is constant, the drain voltage 230D, which is output from the drain switching circuit 23, varies in accordance with the change of the number of antenna elements which are made to function. Thus, if the number of antenna elements, which are made to function, relatively increases, the resistance load of the drain switching circuit 23 increases, and causes a voltage drop of the drain voltage 230D, this leading to a factor of a decrease in response speed of the rise and fall of the RF pulse signal. In addition, if the number of antenna elements, which are made to function, relatively decreases, this leads to a factor of occurrence of ringing (oscillation of pulse waveform) of the RF pulse signal.

As has been described above, according to the second embodiment, even when the number of antenna elements, which are made to function, is varied, it is possible to realize stabilization of the output characteristics of the RF pulse signal in accordance with the number of antenna elements. Incidentally, since the other advantageous effects are the same as in the case of the above-described first embodiment, a description thereof is omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An antenna apparatus comprising:
   a plurality of amplifier circuits configured to output transmission pulse signals to a plurality of antenna elements, respectively;
   a common drain control circuit configured to constitute a control circuit common to the plurality of amplifier circuits, and to control drain voltages of field-effect transistors included in the respective amplifier circuits;
   a plurality of gate control circuits provided for the respective amplifier circuits, and configured to control gate voltages of the field-effect transistors; and
   an antenna controller configured to control the common drain control circuit and the plurality of gate control circuits, and to selectively operate the plurality of amplifier circuits by controlling an output of the gate voltage prior to the drain voltage.

2. The antenna apparatus of claim 1, wherein the antenna controller is configured to control the common drain control circuit and the plurality of gate control circuits, based on any one of an antenna operation in which the transmission pulse signal is transmitted from any of the plurality of antenna elements, an antenna operation in which the transmission pulse signal is transmitted from a specific antenna element of the plurality of antenna elements, and an antenna operation in which the transmission pulse signal is transmitted from none of the plurality of antenna elements.

3. The antenna apparatus of claim 1, further comprising:
an antenna unit including the plurality of amplifier circuits and the plurality of gate control circuits,
wherein the common drain control circuit is configured to control the drain voltage in units of the antenna unit.

4. The antenna apparatus of claim 3, wherein the common drain control circuit is configured to output the drain voltage to the field-effect transistor included in each of the plurality of amplifier circuits, when the transmission pulse signal is transmitted from at least one of the antenna elements in units of the antenna unit.

5. The antenna apparatus of claim 3, wherein the antenna unit includes a pulse signal generation circuit including the amplifier circuits and the gate control circuits, in association with each of the antenna elements, and
the pulse signal generation circuit is configured to send the transmission pulse signals, which are output from the amplifier circuits, to the associated antenna elements.

6. The antenna apparatus of claim 1, wherein the antenna controller is configured to include a power supply control circuit for stabilizing output characteristics of the transmission pulse signals from the plurality of amplifier circuits, in accordance with a number of antenna elements, which are caused to effectively function, among the plurality of antenna elements.

7. The antenna apparatus of claim 6, wherein the power supply control circuit is configured to control a power supply to the common drain control circuit in a manner to adjust the drain voltage, based on information indicative of the number of antenna elements which are caused to effectively function.

8. The antenna apparatus of claim 7, wherein the power supply control circuit is configured to control the drain voltage by controlling a driving voltage of a field-effect transistor included in the common drain control circuit, based on the information indicative of the number of antenna elements which are caused to effectively function.

9. The antenna apparatus of claim 2, wherein the antenna controller is configured to include a power supply control circuit for stabilizing output characteristics of the transmission pulse signals from the plurality of amplifier circuits, in accordance with a number of antenna elements, which are caused to effectively function, among the plurality of antenna elements.

10. The antenna apparatus of claim 3, wherein the antenna controller is configured to include a power supply control circuit for stabilizing output characteristics of the transmission pulse signals from the plurality of amplifier circuits, in accordance with a number of antenna elements, which are caused to effectively function, among the plurality of antenna elements.

11. The antenna apparatus of claim 4, wherein the antenna controller is configured to include a power supply control circuit for stabilizing output characteristics of the transmission pulse signals from the plurality of amplifier circuits, in accordance with a number of antenna elements, which are caused to effectively function, among the plurality of antenna elements.

12. The antenna apparatus of claim 5, wherein the antenna controller is configured to include a power supply control circuit for stabilizing output characteristics of the transmission pulse signals from the plurality of amplifier circuits, in accordance with a number of antenna elements, which are caused to effectively function, among the plurality of antenna elements.

13. An array antenna apparatus comprising:
a structure in which a plurality of the antenna apparatus of claim 1 is arrayed.

* * * * *